United States Patent
Zelinski et al.

(10) Patent No.: US 7,492,127 B2
(45) Date of Patent: Feb. 17, 2009

(54) SYSTEM AND METHOD FOR BATTERY CALIBRATION IN PORTABLE COMPUTING DEVICES

(75) Inventors: Timothy B. Zelinski, Sayville, NY (US); Thomas Conticello, St. James, NY (US); Darren Kropp, Moriches, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 578 days.

(21) Appl. No.: 11/031,414

(22) Filed: Jan. 7, 2005

(65) Prior Publication Data

US 2007/0216361 A1    Sep. 20, 2007

(51) Int. Cl.
*H01M 10/44* (2006.01)
(52) U.S. Cl. .................... 320/132; 324/426
(58) Field of Classification Search ........... 320/107, 320/132, 149; 324/426, 430, 431, 433
See application file for complete search history.

(56) References Cited

U.S. PATENT DOCUMENTS

| | | | | |
|---|---|---|---|---|
| 5,047,961 A | * | 9/1991 | Simonsen | 702/63 |
| 6,304,087 B1 | * | 10/2001 | Bertness | 324/426 |
| 2002/0167293 A1 | * | 11/2002 | Ptasinski et al. | 320/132 |

* cited by examiner

*Primary Examiner*—Edward Tso
(74) *Attorney, Agent, or Firm*—Fay Kaplun & Marcin, LLP

(57) ABSTRACT

Described is a method which includes a step of initiating a calibration state of a battery status system. The calibration state including charging a battery to a first threshold value; discharging the battery to a second threshold value; and calibrating the battery status system based on the first and second threshold values. Subsequently, the method includes a step of exiting the calibration state. Described is also a portable computing device which includes invades a battery; a controller; and an application executed on the controller for performing calibration of a battery status system of the battery. The application drives the battery to a threshold state and performs the calibration when the battery reaches the threshold state.

26 Claims, 2 Drawing Sheets

SYSTEM AND METHOD FOR BATTERY CALIBRATION IN PORTABLE COMPUTING DEVICES

BACKGROUND

Many portable computing devices are capable of wireless connection to a computer network, such as the Internet, a local network, a corporate network and others. As a result, these devices do not require any wired connections to carry out their functions (e.g., email, web browsing, etc.). Batteries, particularly rechargeable batteries, are commonly used to power the devices, since they provide complete freedom of movement to the users of these devices. Alternatively, power adapters may be used to power the devices using electrical sockets. However, this approach requires tethering the devices to a stationary power supply with cords, reducing portability and usefulness.

These devices typically include a user-viewable screen which includes a battery status display that provides the user with an estimation of a remaining life of the battery. The remaining battery life is based on a battery capacity which is calculated by using a coulomb-counting system ("CCS") which measures a current flow into and out of the battery and integrates the current flow over time. The battery capacity is calculated and recorded by electronics disposed within a battery pack. Over time, however, the calculation introduces an error which may get so large that performance of the device is adversely affected (e.g., reduction in battery life, data loss, memory corruption, etc.). Thus, the calculation may need to be calibrated at a regular interval. However, the calibration is typically performed only when the battery reaches a threshold state (e.g., full charge and then full discharge). Thus, the user has the burden of ensuring that the battery reaches the threshold state so that the CCS may be re-calibrated.

The batteries used in these devices are typically composed of a natural substance (e.g., Li-ion, Li-polymer, NiCad, NiMh). Over time, the natural substance will age and breakdown chemically, thereby reducing effective capacity of the battery. Without performing the calibration at regular intervals, the device typically does not account for this aging and the chemical breakdown that occurs therewith. Thus, the device may inaccurately display the remaining battery life to the user.

SUMMARY OF THE INVENTION

The present invention related to a method which includes a step of initiating a calibration state of a battery status system. The calibration state including charging a battery to a first threshold value; discharging the battery to a second threshold value; and calibrating the battery status system based on the first and second threshold values. Subsequently, the method includes a step of exiting the calibration state.

The present invention also relates to a portable computing device which includes a battery; a controller; and an application executed on the controller for performing calibration of a battery status system of the battery. The application drives the battery to a threshold state and performs the calibration when the battery reaches the threshold state.

DETAILED DESCRIPTION

Figure 1:
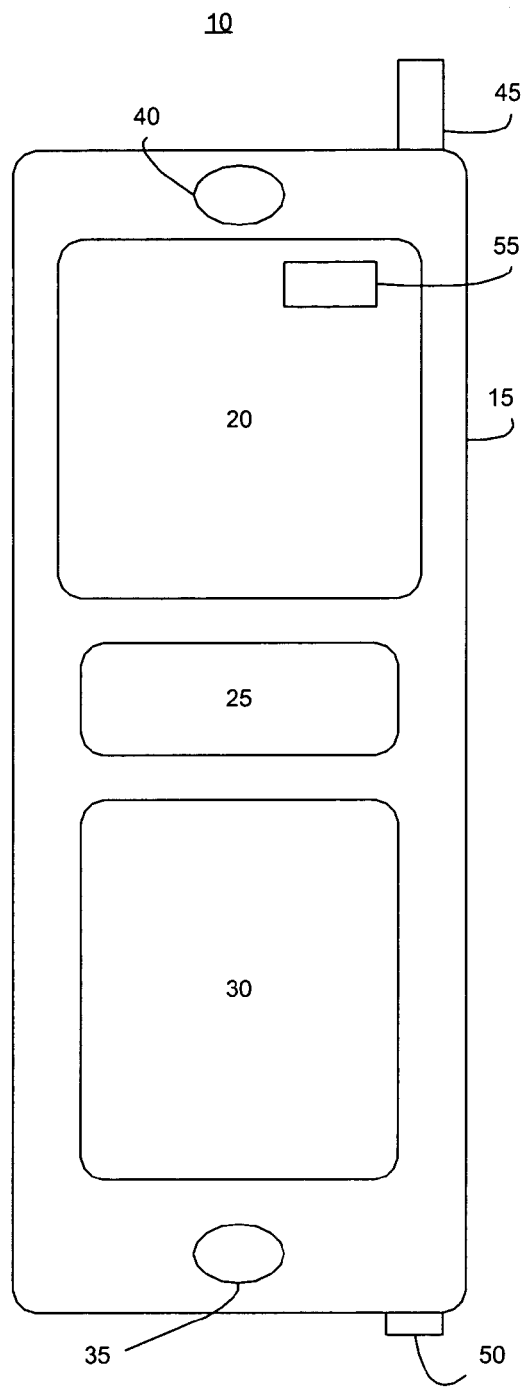
FIG. 1 shows a front view of an exemplary embodiment of portable computing device according to the present invention.

The present invention may be further understood with reference to the following description and the appended drawings, wherein like elements are referred to with the same reference numerals. As shown in FIG. 1, the present invention may be utilized by a portable computing device 10 (e.g., cell phone, PDA, laptop, handheld PC, scanner, interrogator, etc.). The device 10 may include a casing 15 which houses internal electronics of the device 10 and provides protection against impacts and corruption from environmental agents (e.g., dust, liquids, etc.). The casing 15 may be composed of any suitable material which would provide such protection (e.g., plastics, polymers, etc.).

The device 10 may further include a display screen 20, a control element 25 and a data entry element 30. The display screen 20 (e.g., liquid crystal display) may present text and/or image data to a user of the device 10. As would be understood by those skilled in the art, the image data may include still images (e.g., photos, jpegs, gifs) and/or dynamic images (e.g., video, animation, streaming content). The control element 25 may include one or more buttons, dials, depressable regions and/or joysticks that allow the user to operate the device 10. For example, the device 10 may include a "menu" button which, when pressed, presents a list of options (e.g., phonebook, calendar, settings, etc.) on the display screen 20. The data entry element 30 may include an alpha-numeric keypad (not shown) which would allow the user to enter text that may be simultaneously shown on the display screen 20.

As would be understood by those skilled in the art, the above description of the device 10 is merely illustrative of an exemplary portable computing device. For example, the device 10 may not include the control element 25 and/or the data entry element 30, but may include a further embodiment of the display screen 20 in which it functions as a touch-screen. That is, the user may operate the device 10 and/or enter data by manually depressing portions of the screen 20 with an instrument (e.g., stylus) or a finger. Thus, the present invention may be implemented on any portable computing device and is not limited to the particular exemplary embodiments described herein.

The device 10 may further include a microphone 35 and a speaker 40. As would be understood by those skilled in the art, the microphone 35 may be used to receive sound emitted by the user during, for example, a phone call or a voice recording. The speaker 40 may be used to emit sound (e.g., phone call, playback of voice recording, playback of sound accompanying a video, music, incoming call, dial tone, etc.).

An antenna 45 may be disposed on the device 10 to facilitate transmission/reception of a wireless signal to/from the device 10. For example, the device 10 may be connected to a wireless network (e.g, WLAN, WWAN, WPAN, etc.) through which the device 10 may communicate with further electronic devices connected to the network. The device 10 may further include a port 50 which may receive a jack connected to an external power source (e.g., AC, external battery). For example, the device 10 may be connected to the external power source when charging either through the jack or while in a charging cradle (not shown).

Figure 2:
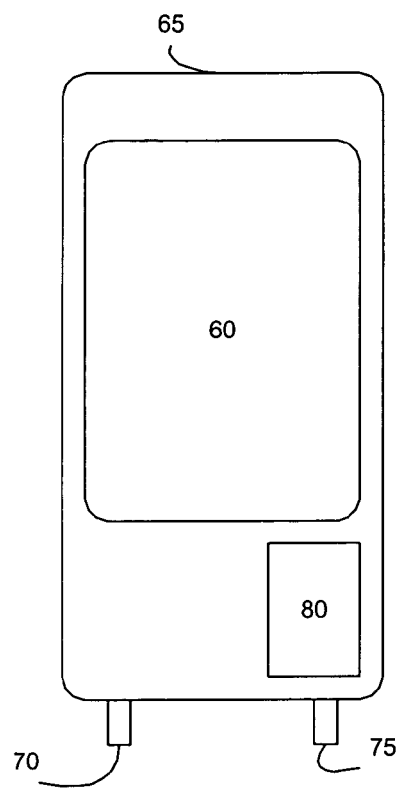
FIG. 2 shows an exemplary embodiment of a battery pack according to the present invention.

According to the present invention, the display screen 20 may further include a battery status indicator 55 which displays a remaining battery life of a battery 60, shown in FIG. 2. As would be understood by those of skill in the art, the battery 60 is preferably rechargeable (e.g., Li-ion, Li-polymer, NiCad, NiMh). As used herein, the term "battery" may refer to any power source typically used in portable computing devices. For example, the battery may also be referred to as a battery cell. The indicator 55 may display the remaining battery life as a series of bars. For example, the indicator 55 may be completely filled with bars when the battery 60 is fully charged, whereas only a single bar may appear when the battery 60 has been nearly fully discharged. Other types of indicators may also be used (e.g., a percentage of battery life remaining, etc.). The indicator 55 may be important to the user, because complete or near complete discharge of the battery 60 may cause the device 10 to disable itself (i.e., shutdown until connected to the power source), which, in turn, may cause loss and/or corruption of data stored in a volatile memory of the device 10.

As shown in FIG. 2, the battery 60 may be housed within a battery pack 65. As stated above with regard to the casing 15, the battery pack 65 may be manufactured such that it protects the battery 60 and internal electronics therein from damage due to impact and/or environmental agents. Those of skill in the art would understand that the battery pack 65 may be removably or non-removably attached to the device 10. Thus, the battery 60 may be charged in several different modes. In one embodiment, the port 50 may receive the jack which is connected to the external power source. In a further embodiment, the device 10 may be placed in the charging cradle which is connected to the external power source. In these embodiments, the battery pack 65 may remain attached to the device 10. However, a further charging cradle may receive only the battery pack 65 after it has been removed from the device 10. In this embodiment, leads 70,75 attached to the battery pack 65 may contact a portion of the cradle that transfers power from the external power source to the battery 60. As understood by those skilled in the art, the battery pack 65 may include a further lead which provides for communication between the device 10 and the battery pack 65.

The battery pack 65 may further include a controller 80. In one embodiment, the controller 80 is a microcontroller or a complex finite state machine integrated circuit which may contain components that typically comprise the controller 80 (e.g., a CPU, RAM, ROM, I/O ports, timers). As understood by those skilled in the art, the microcontroller may be designed to control a particular task within a system or an embedded system. The controller 80 may implement a battery status system, such as a coulomb-counting system ("CCS") which calculates capacity of the battery 60 by measuring current flow into and out of the battery 60 and integrating the current flow over time. The present invention is described with respect to the CCS, but, those of skill in the art will understand that any battery status system which requires calibration may be successfully implemented according to the disclosure herein.

The battery pack 65 which includes the controller 80 may be referred to as a "smart battery," because, the controller 80 may perform a calibration of the CCS. According to the present invention, calibration of the CCS may result in an accurate display of battery capacity, prolonged battery life and/or data preservation. The calibration may be performed when the battery 60 reaches a threshold state (e.g., fully or nearly fully charged and then fully or nearly fully discharged). As would be understood by those skilled in the art, the user may determine when the battery 60 has reached the threshold state. For example, if the device 10 is equipped with an automatic disabling mechanism that turns the device 10 off when the battery 60 is completely or nearly completely discharged, the user may decide to charge the battery 60. However, though the user thinks the device 10 has reached the threshold state, the user may be wrong, because conventional auto-disable mechanisms turn off the device when the battery is at a lower capacity (e.g., 10% remaining) but not fully discharged. Thus, the calibration may not be performed. Without performing the calibration, the CCS may introduce an error that accumulates over time and adversely affects performance of the device 10 (e.g., reduction in battery life, data loss/corruption).

According to the present invention, an application is provided that may cause the battery 60 to initiate a calibration state thereby reaching the threshold state, and thus, performing the calibration of the CCS and removing the error associated with the user determination. As would be understood by those skilled in the art, the application may be implemented in software or hardware in the device 10 and/or the controller 80.

Figure 3:
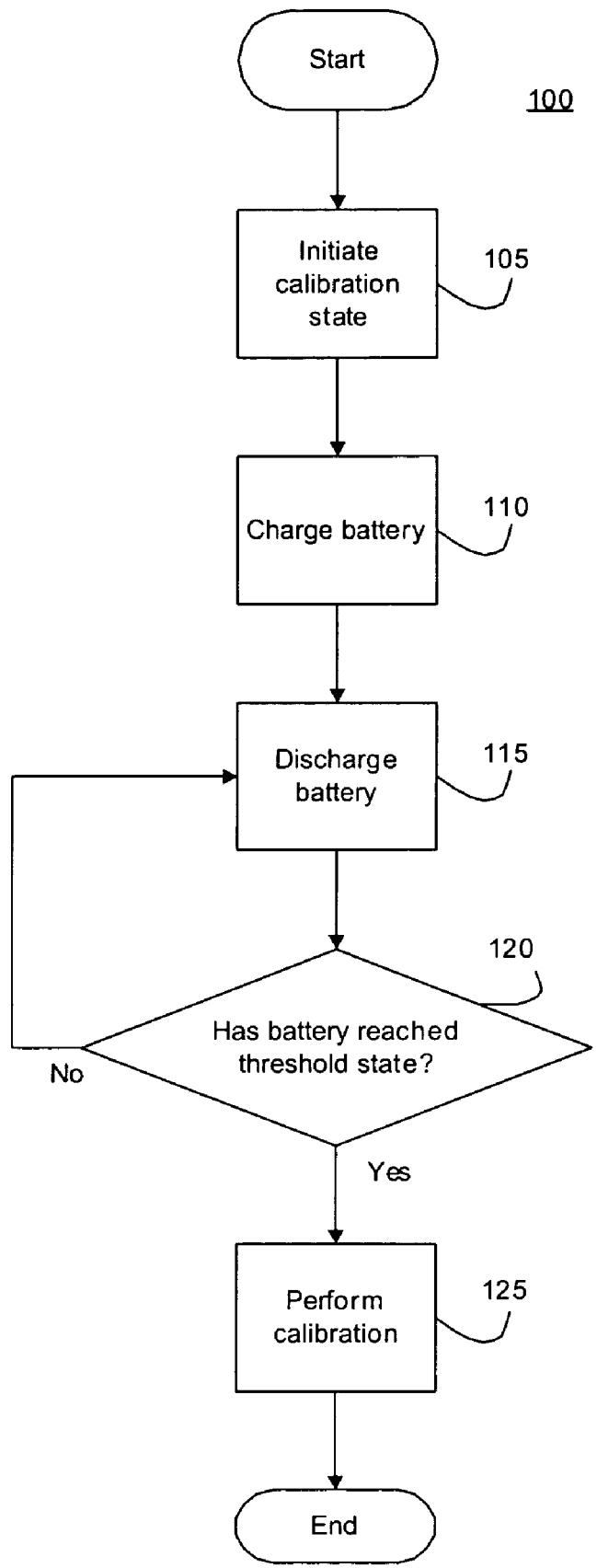
FIG. 3 shows an exemplary embodiment of a method employing a calibration system according to the present invention.

An exemplary embodiment of a method 100 according to the present invention is shown in FIG. 3. In step 105, a calibration state is initiated by triggering the application. Prior to initiation of the calibration state, the device 10 may indicate to the user that calibration is required/recommended based on a time of a prior calibration and/or the above-mentioned error has caused the CCS to become inaccurate to a point that the user loses productivity. However, the calibration state may be initiated even if the device 10 does not indicate that the calibration is required/recommended. For example, the user may believe that the device 10 is falsely or inaccurately reporting the battery capacity or that the device 10 is disabling prematurely.

The user may trigger the application manually by, for example, pressing one or more buttons on the device 10 and/or touching an icon on the display screen 20 with a finger or the stylus. In a further exemplary embodiment, the application may be triggered automatically. For example, the device 10 may be programmed to trigger the application at a certain time (e.g., overnight, after a period of non-use) or when the battery 60 is completely or nearly completely discharged. In yet a further exemplary embodiment, the device 10 may display a message to the user on the display screen 20 indicating that calibration has not been performed for a prolonged period of time. Thus, the user may trigger the application, and/or the device 10 may be configured to trigger the application automatically if the user does not manually trigger the application after a predetermined number of days or times the message is displayed.

In one exemplary embodiment, the application may not be triggered unless the device 10 is connected to the external power source. Thus, the application may determine whether the device 10 is connected to the external power source before proceeding with the method 100. In a further exemplary embodiment, the user may be prompted to connect the device 10 the external power source. For example, the display screen 20 may show a prompt which indicates that the calibration state is about to begin, and thus, the user may connect the device 10 to the external power source, otherwise any data in a volatile memory of the device 10 may be lost or corrupted while or after the application executes.

In step 110, the battery 60 is charged to a fully charged or nearly fully charged state. The application may be configured to determine when the battery 60 has reached the threshold state. As would be understood by those skilled in the art, the battery 60 is preferably charged to the threshold state at which the calibration is performed. The battery 60 may be charged by the external power source according to the methods described above (i.e., jack, device charging cradle, battery charging cradle, etc.).

In step 115, the battery 60 is fully or nearly fully discharged. That is, the battery 60 may be driven to the threshold state. Prior to discharging the battery 60, the external power source may be removed or disabled, thereby allowing the battery 60 to discharge faster. To further accomplish the faster discharge, the application may "turn on" one or more peripherals (e.g., backlight, display screen 20, vibrate motor, ringer, allow a microprocessor to run at full speed, set a radio to fully drain the battery 60, etc.). As would be understood by those of skill in the art, the device 10 is preferably put in a highest power state, in which the battery 60 is being discharged at a fastest possible rate. Furthermore, the application may disable an auto-disable mechanism of the device 10. For example, the device 10 may typically shut-down ("turn off") when the battery 60 has been fully or nearly fully discharged. The application may disable and/or prevent the auto-disable mechanism from executing.

As understood by those skilled in the art, the device 10 may remain connected to the external power source while being discharged. For example, it may be disadvantageous to deprive the device 10 of power completely, because data in the volatile memory of the device 10 may be lost and/or corrupted. Therefore, the device 10 may be sustained by the external power source while the battery has been fully discharged.

In step 120, the application determines whether the battery 60 has reached the threshold state (i.e., fully or nearly fully discharged). If the battery 60 has not reached the threshold state, the application continues to discharge the battery 60 until the threshold state is reached. If the battery 60 has reached the threshold state, the calibration of the CCS is performed, as seen in step 125.

Once the calibration has been performed, the application may restore the device 10 to a pre-calibration mode. That is, the application may turn off the peripherals, enable the charger and/or enable the auto-disable mechanism. Furthermore, the device 10 may indicate to the user via, for example, a message on the display screen 20, an LED or a sound that the CCS has been calibrated and/or that the battery 60 is being charged by the external power source.

As would be understood by those skilled in the art, a further exemplary embodiment of the method 100 according to the present invention may include discharging the battery 60 to the threshold state (i.e., fully or nearly fully discharged) and performing calibration. Then, the battery 60 may be charged to the threshold state (i.e., fully or nearly fully charged) and the calibration performed. That is, the charging and discharging steps may occur in any order.

In a further exemplary embodiment of the present invention, the device 10 may indicate an age of the battery 60 and/or that the battery 60 is beyond its useful life (i.e., will not hold the charge, is too rapidly discharged). That is, for example, Lithium ions that comprise the battery 60 experience a chemical breakdown over time, which reduces the effective capacity of the battery 60. The device 10 may not be aware of the full effect of the breakdown if the calibration is not performed at regular intervals. As such, this indication may occur, for example, when the calibration state is initiated, during the calibration state and/or after the calibration state has finished.

The present invention has been described with reference to the device 10, the battery 60, and the application. Accordingly, various modifications and changes may be made to the embodiments without departing from the broadest spirit and scope of the present invention as set forth in the claims that follow. The specification and drawings, accordingly, should be regarded in an illustrative rather than restrictive sense.

What is claimed is:

1. A method, comprising:
   initiating a calibration state of a battery status system, the calibration state including,
   charging a battery to a first threshold value;
   discharging the battery to a second threshold value; and
   calibrating the battery status system based on the first and second threshold values; and
   exiting the calibration state.

2. The method according to claim 1, wherein the battery status system is a coulomb counting system.

3. The method according to claim 1, further comprising:
   indicating to a user that the calibration state is one of recommended and required.

4. The method according to claim 1, further comprising:
   connecting the battery to an external power source prior to initiating the calibration state.

5. The method according to claim 4, wherein the battery is charged by the external power source.

6. The method according to claim 1, wherein discharging the battery includes removing an external power source from the battery.

7. The method according to claim 1, wherein discharging the battery includes powering at least one peripheral which derives power from the battery.

8. The method according to claim 1, wherein discharging the battery includes disabling an auto-disable mechanism of the battery.

9. The method according to claim 1, wherein the first threshold value is fully charged.

10. The method according to claim 1, wherein the second threshold value is fully discharged.

11. A portable computing device, comprising:
    a battery;
    a controller; and
    an application executed on the controller for performing calibration of a battery status system of the battery, wherein the application charges the battery to a first threshold state;
    discharges the battery to a second threshold state; and
    performs the calibration when the battery reaches the second threshold state.

12. The portable computing device according to claim 11, wherein the battery status system is a coulomb counting system.

13. The portable computing device according to claim 11, wherein the controller is one of a microcontroller and a complex finite state machine integrated circuit.

14. The portable computing device according to claim 11, wherein the threshold state is a full charge of the battery.

15. The portable computing device according to claim 14, wherein the battery is driven to the full charge by connection to an external power source.

16. The portable computing device according to claim 11, wherein the threshold state is full discharge of the battery.

17. The portable computing device according to claim 16, wherein the battery is driven to the full discharge by one of powering at least one peripheral of the device and disabling an auto-disable mechanism of the device.

18. The portable computing device according to claim 11, wherein the battery comprises one of Li ions, Li polymers, NiCad and NiMh.

19. A battery pack, comprising:
    a battery;
    a controller; and an application executed on the controller for performing calibration of a battery status system of the battery, wherein the application charges the battery to a first threshold state;

discharges the battery to a second threshold state; and performs the calibration when the battery reaches the second threshold state.

20. The battery pack according to claim 19, wherein the battery status system is a coulomb counting system.

21. The battery pack according to claim 19, wherein the controller is one of a microcontroller and a complex finite state machine integrated circuit.

22. The battery pack according to claim 19, wherein the threshold state is a full charge of the battery.

23. The battery pack according to claim 22, wherein the battery is driven to the full charge by connection to an external power source.

24. The battery pack according to claim 19, wherein the threshold state is full discharge of the battery.

25. The battery pack according to claim 24, wherein the battery is driven to the full discharge by one of powering at least one peripheral of the device and disabling an auto-disable mechanism of the device.

26. The battery pack according to claim 19, wherein the battery comprises one of Li ions, Li polymers, NiCad and NiMh.

* * * * *